US009627557B2

(12) United States Patent
Arimoto et al.

(10) Patent No.: US 9,627,557 B2
(45) Date of Patent: Apr. 18, 2017

(54) SOLAR CELL

(71) Applicant: Sanyo Electric Co., Ltd., Moriguchi, Osaka (JP)

(72) Inventors: Mamoru Arimoto, Kobe (JP); Yasuko Hirayama, Kobe (JP); Takahiro Mishima, Kobe (JP); Kazunori Fujita, Kobe (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 0 days.

(21) Appl. No.: 14/033,653

(22) Filed: Sep. 23, 2013

(65) Prior Publication Data
US 2014/0020754 A1   Jan. 23, 2014

Related U.S. Application Data

(63) Continuation of application No. PCT/JP2012/053496, filed on Feb. 15, 2012.

(30) Foreign Application Priority Data

Mar. 25, 2011  (JP) ................................. 2011-067007

(51) Int. Cl.
  *H01L 31/0224*  (2006.01)
  *H01L 31/068*  (2012.01)
  *H01L 31/0747*  (2012.01)

(52) U.S. Cl.
  CPC ............. *H01L 31/022441* (2013.01); *H01L 31/02245* (2013.01); *H01L 31/0682* (2013.01); *H01L 31/0747* (2013.01); *Y02E 10/547* (2013.01)

(58) Field of Classification Search
  CPC ......... H01L 31/022441; H01L 31/0682; H01L 31/0747; H01L 31/02245; H01L 31/022458
  See application file for complete search history.

(56) References Cited

U.S. PATENT DOCUMENTS

| 2011/0000532 A1 | 1/2011 | Niira et al. |
| 2011/0023956 A1* | 2/2011 | Harder ............ H01L 31/022441 136/256 |
| 2011/0041910 A1 | 2/2011 | Shimomura et al. |

FOREIGN PATENT DOCUMENTS

| JP | 2003-124483 A | 4/2003 |
| JP | 2009-200267 A | 9/2009 |

(Continued)

*Primary Examiner* — Eric R Smith
(74) *Attorney, Agent, or Firm* — Mots Law, PLLC

(57) ABSTRACT

The solar cell (1) of the present invention is provided with an n-side electrode (14), a p-side electrode (15), and a photoelectric conversion unit (20) having a first main surface (20*a*) and a second main surface (20*b*). The first main surface (20*a*) includes an n-type surface (20*an*) and a p-type surface (20*ap*). The photoelectric conversion unit (20) has a semiconductor substrate (10) and a semiconductor layer (12*n*). The semiconductor substrate (10) has first and second main surfaces (10*b*, 10*a*). The semiconductor layer (12*n*) is arranged on a portion of the first main surface (10*b*). The semiconductor layer (12*n*) constitutes either the n-type surface (20*an*) or the p-type surface (20*ap*). The semiconductor layer (12*n*) includes a relatively thick portion (12*n*1) and a relative thin portion (12*n*2). The n-side electrode (14) or the p-side electrode (15) is arranged on at least the relatively thin portion (12*n*2) of the semiconductor layer (12*n*). The solar cell of the present invention, by means of the aforementioned configuration, is able to extend the lifetime of the minor carriers by means of the relatively thick portion (12*n*1), to maintain low resistance between the semiconductor substrate (10) and the n-side electrode (14) by means of the relatively thin portion (12*n*2), and to increase hole and electron collection efficiency.

10 Claims, 13 Drawing Sheets

(56) References Cited

FOREIGN PATENT DOCUMENTS

JP        2010-080887 A     4/2010
WO     2009/096539 A1   8/2009

* cited by examiner

SOLAR CELL

CROSS-REFERENCE TO RELATED APPLICATIONS

This is a continuation of International Application PCT/JP2012/053496, with an international filing date of Feb. 15, 2012, filed by applicant, the disclosure of which is hereby incorporated by reference in its entirety.

FIELD OF THE INVENTION

The present invention relates to a back contact solar cell.

BACKGROUND

A so-called back contact solar cell has been proposed in Patent Document 1 in which p-type and n-type semiconductor regions are formed on the back surface of the solar cell. The back contact solar cell does not require an electrode on the light-receiving surface. As a result, light-receiving efficiency can be improved in a back contact solar cell. Therefore, higher photoelectric conversion efficiency can be realized.

CITED DOCUMENTS

Patent Documents

Patent Document 1: Laid-Open Patent Publication No. 2010-80887

SUMMARY

Problem Solved by the Invention

There is increasing demand for a solar cell having high photoelectric conversion efficiency and reliability.

In view of this situation, it is an object of the present invention to provide a solar cell having high photoelectric conversion efficiency.

Means of Solving the Problem

The solar cell of the present invention is provided with photoelectric conversion unit, an n-side electrode, and a p-side electrode. The photoelectric conversion unit has a first main surface and a second main surface. The first main surface includes an n-type surface and a p-type surface. The n-side electrode is connected electrically to the n-type surface. The p-side electrode is connected electrically to the p-type surface. The photoelectric conversion unit has a semiconductor substrate and a semiconductor layer. The semiconductor substrate has first and second main surfaces. The semiconductor layer is arranged on a portion of said first main surface. The semiconductor layer constitutes either the n-type surface or the p-type surface. The semiconductor layer includes a relatively thick portion and a relative thin portion. Either the n-side electrode or the p-side electrode is arranged on at least the relatively thin portion of the semiconductor layer.

Effect of the Invention

The present invention is able to provide a solar cell having high photoelectric conversion efficiency.

DETAILED DESCRIPTION

Figure 1:
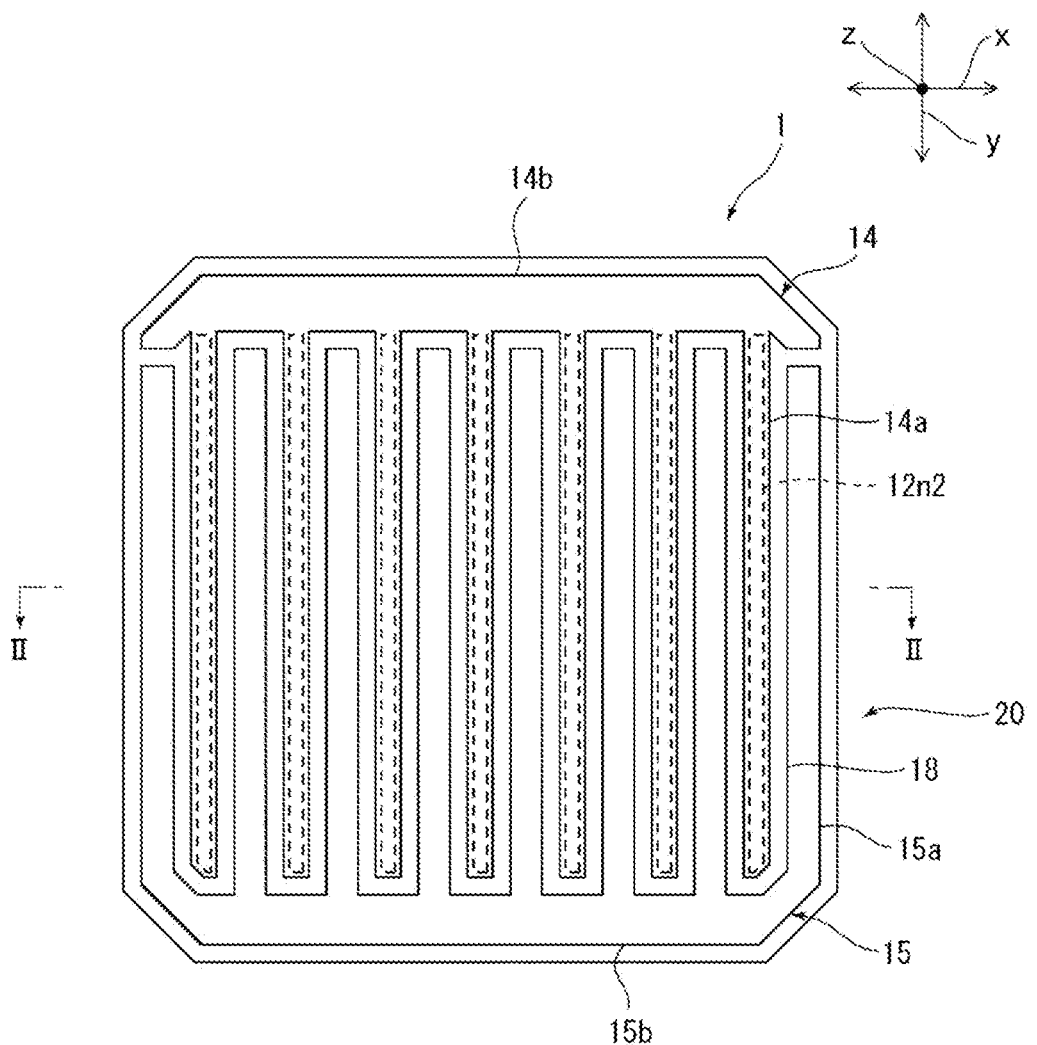
FIG. 1 is a schematic plan view of the solar cell in a first embodiment of the present invention.

The following is an explanation of preferred embodiments of the present invention. The following embodiments are merely examples. The present invention is not limited to the following embodiments in any way.

Further, in each of the drawings referenced in the embodiments, members having substantially the same function are denoted by the same symbols. The drawings referenced in the embodiments are also depicted schematically. The dimensional ratios of the objects depicted in the drawings may differ from those of the actual objects. The dimensional ratios of objects may also vary between drawings. The specific dimensional ratios of the objects should be determined with reference to the following explanation.

1st Embodiment

Configuration of Solar Cell 1

Figure 2:
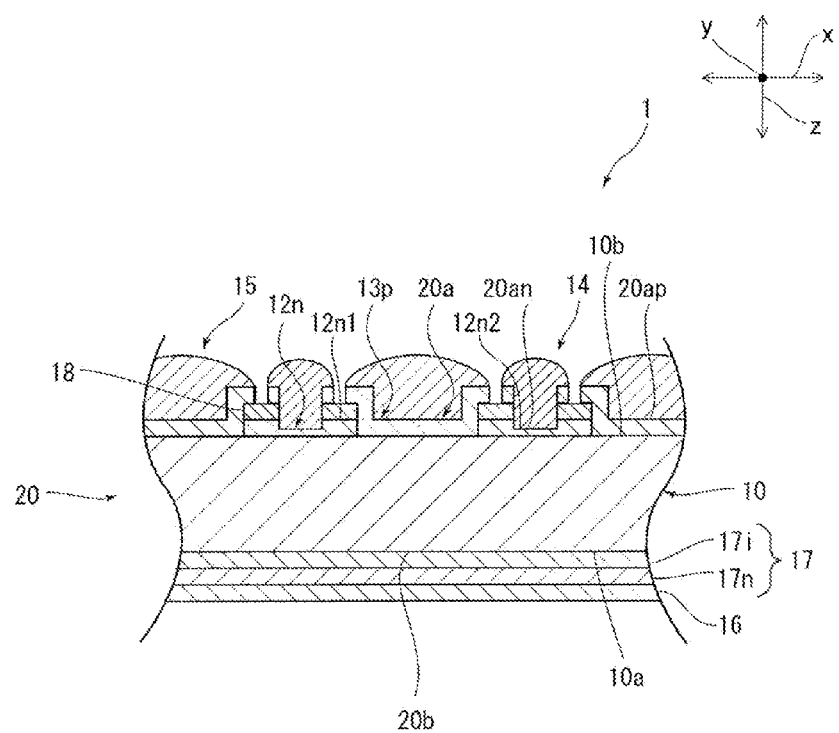
FIG. 2 is a schematic cross-sectional view from line II-II in FIG. 1.

FIG. 1 is a schematic plan view of the solar cell 1 in a first embodiment of the present invention. FIG. 2 is a schematic cross-sectional view from line II-II in FIG. 1.

The solar cell 1 is a back contact solar cell. The solar cell 1 is provided with a photoelectric conversion unit 20. The photoelectric conversion unit 20 has a back surface 20a and a light-receiving surface 20b. The back surface 20a constitutes the first main surface of the photoelectric conversion unit 20. The light-receiving surface 20b constitutes the second main surface of the photoelectric conversion unit 20. The light-receiving surface 20b is the main surface primarily used to receive light. It receives much more light than the back surface 20a. When light is received by the light-receiving surface 20b, the photoelectric conversion unit 20 generates carriers (electrons and holes).

The photoelectric conversion unit 20 has a semiconductor substrate 10 having one type of conductivity. More specifically, in the present embodiment, the semiconductor substrate 10 is a substrate comprising an n-type crystalline semiconductor. A specific example of a substrate comprising an n-type crystalline semiconductor is an n-type single-crystal silicon substrate.

The semiconductor substrate 10 has first and second main surfaces 10b and 10a. The light-receiving surface 20b of the photoelectric conversion unit 20 is composed of the second main surface 10a of the semiconductor substrate 10. The light-receiving surface 20b composed of the second main surface 10a has a textured structure. Here, "textured structure" means an uneven structure formed to suppress surface reflection and increase the amount of light absorbed by the photoelectric conversion unit. Specific examples of textured structures include a pyramidal uneven structure (pyramid or truncated pyramid) obtained by performing anisotropic etching on the surface of a single-crystal silicon substrate having a (100) plane, and an uneven structure obtained by performing isotropic etching, such as acid etching or dry etching, on the surface of a single-crystal silicon substrate or polycrystalline silicon substrate.

The semiconductor layer 17 is arranged on the second main surface 10a. The semiconductor layer 17 has an i-type amorphous semiconductor layer 17i and an n-type amorphous semiconductor layer 17n.

Semiconductor layer 17i is arranged on the second main surface 10a. Semiconductor layer 17i can be made of an i-type amorphous silicon containing hydrogen. There are no particular restrictions on the thickness of the semiconductor layer 17i as long as the thickness does not substantially contribute to the generation of power. The thickness of the semiconductor layer 17i can be from several Å to 250 Å.

The n-type semiconductor layer 17n is arranged on semiconductor layer 17i. Semiconductor layer 17n is a semiconductor layer with the same type of conductivity as the semiconductor substrate 10. Semiconductor layer 17n can be made of an n-type amorphous silicon containing hydrogen. There are no particular restrictions on the thickness of the semiconductor layer 17n. The thickness of the semiconductor layer 17n can be from 50 Å to 500 Å.

A protective film 16 is arranged on the semiconductor layer 17. In the present embodiment, the insulating film 16 also includes the functions of a antireflection film. The insulating layer 16 can be formed from a silicon oxide film, a silicon nitride film, or a silicon oxynitride film. A protective film 16 made of silicon nitride is preferred. The thickness of the insulating layer 16 can be, for example, from 80 nm to 1 μm.

There is no light-blocking component such as a metal electrode on the light-receiving surface 20b. As a result, light can be received by the solar cell 1 in the present embodiment substantially over the entire light-receiving surface 20b.

The n-type semiconductor layer 12n is arranged on a first region of the first main surface 10b of the semiconductor substrate 10. The n-type semiconductor layer 12n forms the n-type surface 20an constituting a portion of the back surface 20a.

The n-type semiconductor layer 12n is made of an n-type amorphous semiconductor layer. More specifically, the n-type semiconductor layer 12n is made of an n-type amorphous silicon layer containing hydrogen. The thickness of the n-type semiconductor layer 12n can be from 20 Å to 500 Å.

The p-type semiconductor layer 13p is arranged on a second region different from the first region of the first main surface 10b of the semiconductor substrate 10. The p-type semiconductor layer 13p forms the p-type surface 20ap constituting a portion of the back surface 20a.

The entirety of the first main surface 10b is substantially covered by the n-type semiconductor layer 12n and the p-type semiconductor layer 13p.

The p-type semiconductor layer 13p is made of a p-type amorphous semiconductor layer. More specifically, the p-type semiconductor layer 13p is made of a p-type amorphous silicon layer containing hydrogen. The thickness of the p-type semiconductor layer 13p can be from 20 Å to 500 Å.

An i-type semiconductor layer having a thickness from several Å to 250 Å so as not to substantially contribute to the generation of electricity may be arranged between the first main surface 10b and each of the n-type semiconductor layer 12n and the p-type semiconductor layer 13p. The i-type semiconductor layer can be made of i-type amorphous silicon containing hydrogen. This configuration can further improve the interfacial characteristics between the first main surface 10b and each of the n-type semiconductor layer 12n and the p-type semiconductor layer 13p. Therefore, even better photoelectric conversion efficiency is obtained.

An insulating layer 18 is provided on a portion of the n-type semiconductor layer 12n. More specifically, an insulating layer 18 is formed on both ends of the n-type semiconductor layer 12n in the x direction, excluding the central portion. The central portion of the n-type semiconductor layer 12n in the x direction is exposed from the insulating layer 18.

The p-type semiconductor layer 13p is provided so as to span a portion of the first main surface 10b adjacent to the n-type semiconductor layer 12n in the x direction and at least a portion of the insulating layer 18. In other words, the insulating layer 18 is arranged between the portion in which the n-type semiconductor layer 12n and the p-type semiconductor layer 13p overlap in the z direction (thickness direction).

There are no particular limitations on the material of the insulating layer 18. The insulating layer 18 can be a silicon oxide film, silicon nitride film, or silicon oxynitride film. Among these, an insulating layer 18 made of a silicon nitride film is preferred. Also, the insulating layer 18 preferably contains hydrogen.

The n-side electrode 14 is arranged on the n-type surface 20an. The n-side electrode 14 is connected electrically to the n-type surface 20an. The n-side electrode 14 collects electrons, which are the majority carriers.

The p-side electrode 15 is arranged on the p-type surface 20ap. The p-side electrode 15 is connected electrically to the p-type surface 20ap. The p-side electrode 15 collects holes, which are the minority carriers. The n-side electrode 14 and the p-side electrode 15 are separated electrically on the surface of the insulating layer 18.

The n-side electrode 14 and the p-side electrode 15 are both comb-shaped. The n-side electrode 14 and the p-side electrode 15 are interdigitated and inserted between each other. More specifically, the n-side electrode 14 and the p-side electrode 15 have a plurality of finger portions 14a and 15a, and busbar portions 14b and 15b constituting the collection portion, respectively. Each of the finger portions 14a extends in the y direction (first direction). The plurality of finger portions 14a is arranged at intervals in the x direction (second direction) which is perpendicular to the y direction. Each of the finger portions 15a extends in the y direction (first direction). The plurality of finger portions 15a is arranged at intervals in the x direction (second direction) which is perpendicular to the y direction. The plurality of finger portions 14a and 15a are arranged alternatingly in the x direction.

The finger portions 14a are connected electrically to the busbar portion 14b. The finger portions 15a are connected electrically to the busbar portion 15b. The busbar portions 14b and 15b extend in the x direction.

Each of the n-side electrode 14 and the p-side electrode 15 may be made of a conductive material such as a transparent conductive oxide (TCO), a metal such as Ag, Cu, Sn, Pt or Au, or an alloy of at least one of these metals. The n-side electrode 14 and the p-side electrode 15 may be made of a multilayer having a plurality of conductive layers. In this case, the n-side electrode 14 and the p-side electrode 15 are each preferably formed from a multilayer having a TCO layer formed on the n-type semiconductor layer 12n or the p-type semiconductor layer 13p, respectively, on top of which at least one metal layer or metal alloy layer is formed.

There are no particular restrictions on the method used to form the n-side electrode 14 and the p-side electrode 15. Each of the n-side electrode 14 and the p-side electrode 15 can be formed using a thin-film forming method, such as a sputtering method, CVD method or a vapor deposition method; a plating method; or any combination of these methods.

The n-type semiconductor layer 12n includes a relatively thick portion 12n1 and a relatively thin portion 12n2. The n-side electrode 14 is arranged at least on the relatively thin portion 12n2 of the n-type semiconductor layer 12n. The relatively thin portion 12n2 makes direct contact with the n-side electrode 14.

More specifically, as shown in FIG. 1, the relatively thin portion 12n2 is provided beneath each of the plurality of finger portions 14a. The relatively thin portion 12n2 has a linear shape and extends beneath the finger portions 14a in the y direction, which is the direction in which the finger portions 14a extend. The relatively thin portion 12n2 is provided continuously from one end of the finger portions 14a to the other in the y direction.

The width of the relatively thin portion 12n2 in the x direction is smaller than the width of the finger portions 14a in the x direction. The relatively thin portion 12n2 is provided beneath the central portion of the finger portions 14a in the x direction. More specifically, the relatively thin portion 12n2 is provided over the entire portion of the n-type semiconductor layer 12n that is exposed from the insulating layer 18 and connected to the finger portions 14a. In the present invention, the relatively thin portion 12n2 is not provided beneath the insulating layer 18.

The relatively thin portion 12n2 is not provided below the busbar portion 14b. In other words, the busbar portion 14b is provided on the relatively thick portion 12n1.

The thickness (T1) of the relatively thin portion 12n2 is preferably from 0.2 to 0.8 times the thickness (T2) of the relatively thick portion 12n1.

From the perspective of improving the photoelectric conversion efficiency of solar cells, it is important to somehow control the disappearance of the minority carriers due to recombining From the perspective of controlling the recombining of minority carriers, the semiconductor layer provided on top of the semiconductor substrate is preferably thick and contains hydrogen. This increases the bandgap and extends the lifetime of the minority carriers.

However, when the semiconductor layer is thick and the semiconductor layer contains hydrogen, the resistance between the semiconductor substrate and the electrode increases. This reduces the carrier collection efficiency.

Here, a relatively thick portion 12n1 and a relatively thin portion 12n2 are provided in the n-type semiconductor layer 12n. By providing a relatively thick portion 12n1, the lifetime of the minority carriers (holes) generated beneath the n-type semiconductor layer 12n can be extended. This also increases the efficiency with which the p-side electrode 15 collects the minority carriers (holes) generated beneath the n-type semiconductor layer 12n. Because a relatively thin portion 12n2 in direct contact with the n-side electrode 14 is provided in the n-type semiconductor layer 12n, the resistance between the semiconductor substrate 10 and the n-side electrode 14 can be kept low, even when the relatively thick portion 12n1 is made thicker. This can also maintain a high level of electron collection efficiency.

Therefore, the solar cell 1 in the present embodiment, which includes both a relatively thick portion 12n1 and a relatively thin portion 12n2 in the n-type semiconductor layer 12n, has high photoelectric conversion efficiency.

Both the n-type semiconductor layer 12n and the p-type semiconductor layer 13p contain hydrogen. The entire first main surface 10b is covered substantially by the n-type semiconductor layer 12n and the p-type semiconductor layer 13p which both contain hydrogen. This can further extend the lifetime of the carriers. Therefore, even better photoelectric conversion efficiency can be realized.

When an insulating layer 18 is arranged on a portion of the n-type semiconductor layer 12n, the portion of the n-type semiconductor layer 12n which comes into contact with the n-side electrode 14 is preferably the relatively thin portion 12n2. The portion of the n-type semiconductor layer 12n which comes into contact with the insulating layer 18 but which does not come into contact with the n-side electrode 14 is preferably the relatively thick portion 12n1. This can both reduce the resistance between the n-type semiconductor layer 12n and the semiconductor substrate 10 and extend the lifetime of the minority carriers.

From the perspective of further reducing the resistance between the n-side electrode 14 and the semiconductor substrate 10, the relatively thin portion is preferably also provided in the busbar portion 14b. However, the busbar portion 14b is wider than the finger portions 14a. For this reason, the distance the minority carriers generated beneath the busbar portion 14b have to travel to be collected by the electrode 15 is greater than the distance the minority carriers generated beneath the finger portion 14a have to travel to be collected by the electrode 15. As a result, the minority carriers generated beneath the busbar portion 14b readily disappear due to recombining before they are collected by the p-side electrode 15. Therefore, from the perspective of obtaining even better photoelectric conversion efficiency, the relatively thin portion of the n-type semiconductor layer 12n is preferably not provided beneath the busbar portion 14b. Instead, the busbar portion 14b is preferably provided on top of the relatively thick portion 12n1.

Manufacturing Method for Solar Cell 1

Figure 3:
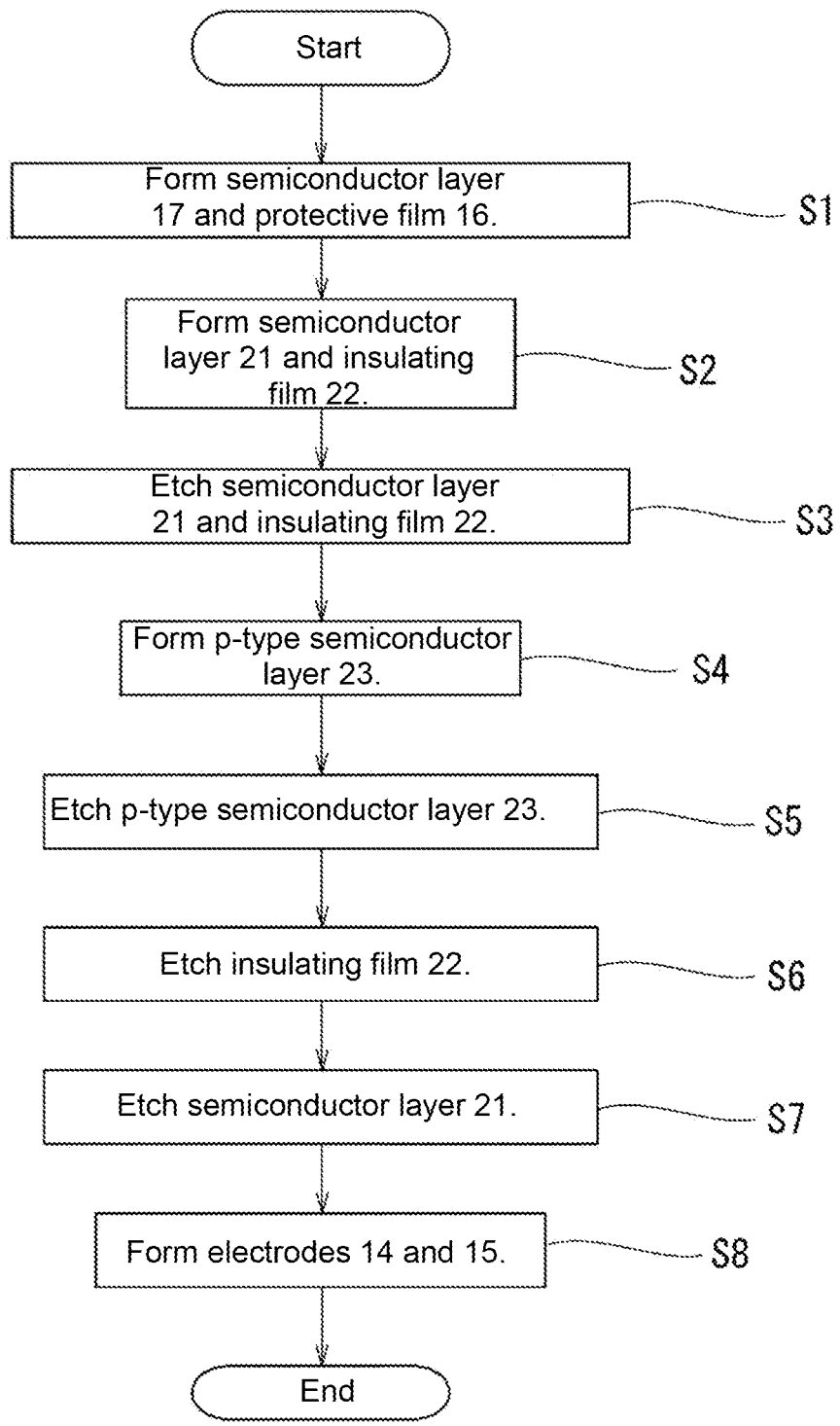
FIG. 3 is a flowchart showing the manufacturing steps for the solar cell in the first embodiment.
Figure 4:
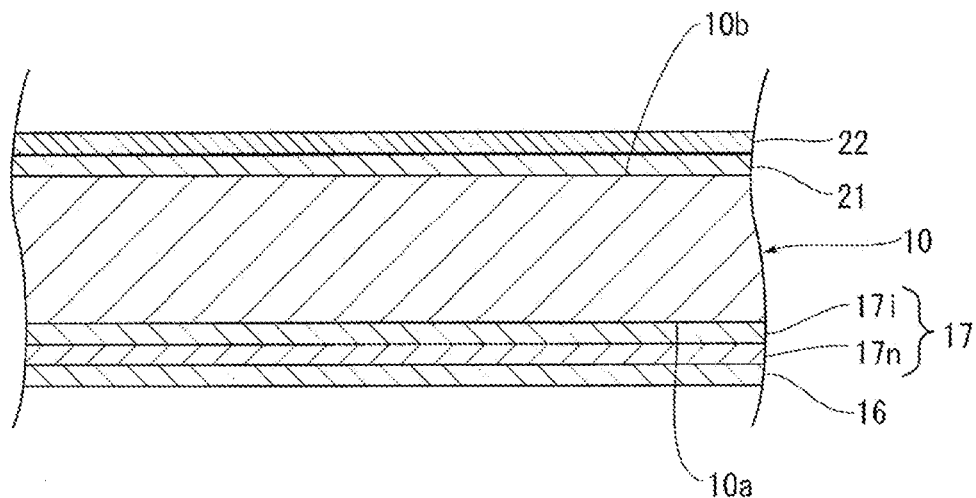
FIG. 4 is a schematic cross-sectional view used to explain a manufacturing step for the solar cell in the first embodiment.
Figure 5:
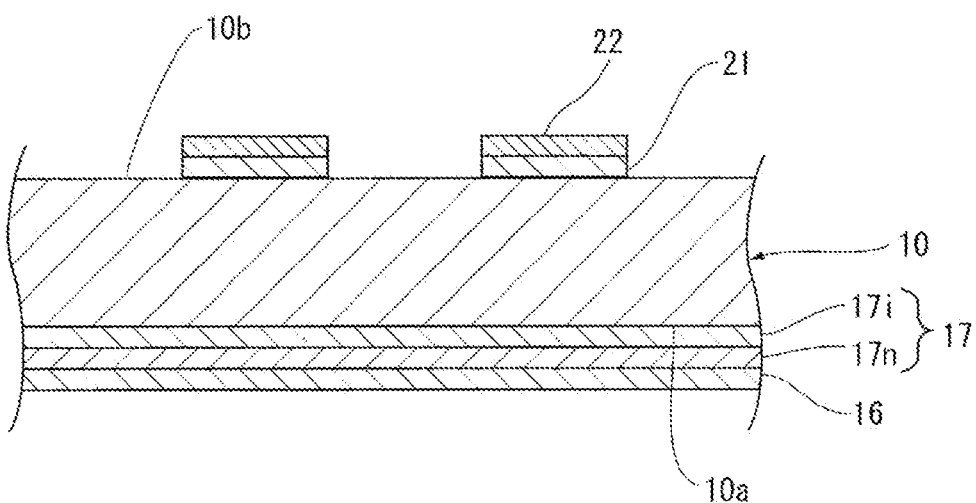
FIG. 5 is a schematic cross-sectional view used to explain a manufacturing step for the solar cell in the first embodiment.
Figure 6:
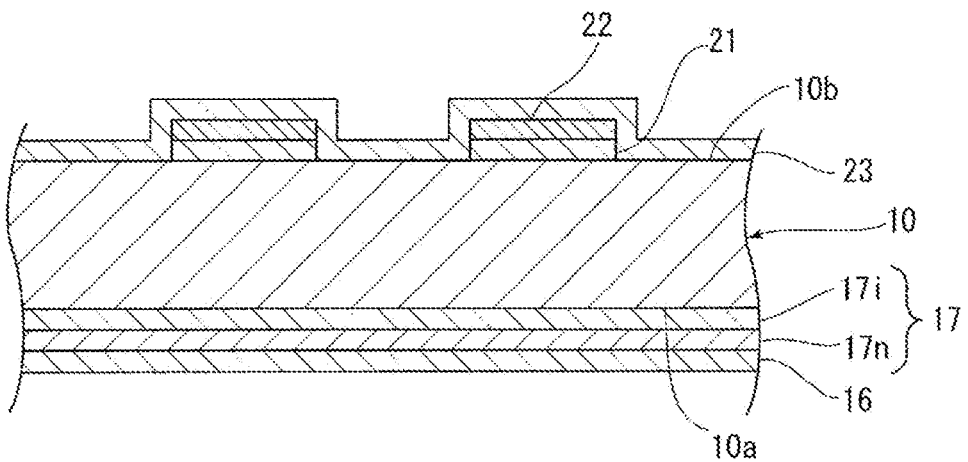
FIG. 6 is a schematic cross-sectional view used to explain a manufacturing step for the solar cell in the first embodiment.
Figure 7:
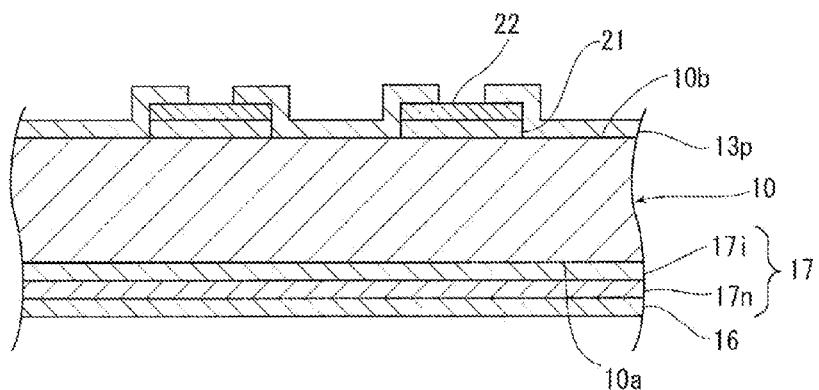
FIG. 7 is a schematic cross-sectional view used to explain a manufacturing step for the solar cell in the first embodiment.
Figure 8:
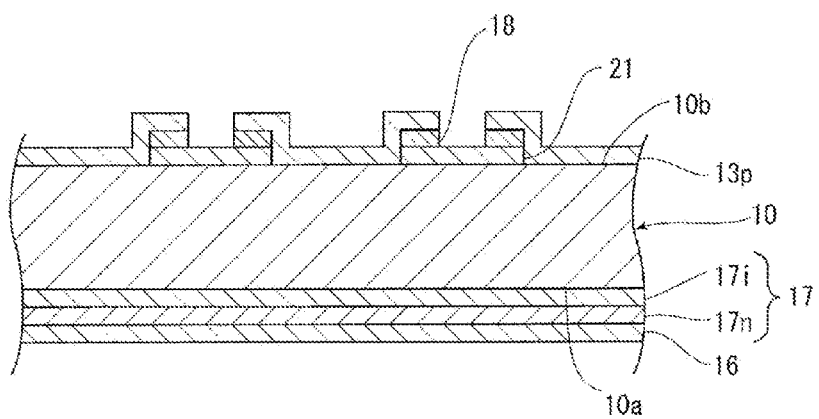
FIG. 8 is a schematic cross-sectional view used to explain a manufacturing step for the solar cell in the first embodiment.

The following is an explanation of an example of a manufacturing process for the solar cell in the present embodiment with reference primarily to FIG. 3 through FIG. 8. More specifically, FIG. 3 is a flowchart showing the manufacturing process for the solar cell in the present embodiment. FIG. 4 is a schematic cross-sectional view used to explain Steps S1 and S2. FIG. 5 is a schematic cross-sectional view used to explain Step S3. FIG. 6 is a schematic cross-sectional view used to explain Step S4. FIG. 7 is a schematic cross-sectional view used to explain Step S5. FIG. 8 is a schematic cross-sectional view used to explain Step S6.

First, a semiconductor substrate having a second main surface 10a with a textured structure is prepared. Then, in Step S1, a semiconductor layer 17 and a protective film 16 are formed over most or all of the second main surface 10a of the semiconductor substrate 10. The i-type semiconductor layer 17i, the n-type semiconductor layer 17n and the protective film 16 can be formed using a chemical vapor deposition (CVD) method such as the plasma CVD method or some other thin-film forming method.

Next, in Step S2, an n-type amorphous semiconductor layer 21 and an insulating film 22 are formed in this order over most or all of the first main surface 10b of the semiconductor substrate 10. The n-type amorphous semiconductor layer 21 can be formed using a chemical vapor deposition (CVD) method such as the plasma CVD method or some other thin-film forming method. The insulating film 22 can be formed using a thin-film forming method such as a sputtering method or CVD method.

Next, in Step S3, the n-type amorphous semiconductor layer 21 and the insulating film 22 are etched. A specific example of a preferred etching agent for etching the n-type amorphous semiconductor layer 21 is a hydrofluoric-nitric acid aqueous solution. A specific example of a preferred etching agent for etching the insulating film 22 is an aqueous HF solution.

Next, in Step S4, a p-type semiconductor layer 23 is formed over most or all of the first main surface 10b including over the surface of the insulating film 22. There are no restrictions on the method used to form the p-type semiconductor layer 23. The p-type semiconductor layer 23 can be formed using a thin-film forming method such as the CVD method.

Next, in Step S5, a portion of the p-type semiconductor layer 23 above the insulating film 22 is removed by means of etching. This forms p-type semiconductor layer 13p from p-type semiconductor layer 23. Specific examples of preferred etching agents for etching the p-type semiconductor layer 23 include an alkaline aqueous solution such as aqueous NaOH solution containing NaOH, or a hydrofluoric-nitric acid aqueous solution.

Next, in Step S6, the p-type semiconductor layer 13p is used as a mask, and the exposed portion of the insulating film 22 is removed by means of etching using an etching solution to form insulating layer 18 from insulating film 22 and to expose a portion of the surface of the n-type amorphous semiconductor layer 21. A specific example of a preferred etching agent for etching the insulating film 22 is an aqueous HF solution.

Next, in Step S7, the portion of the n-type amorphous semiconductor layer 21 exposed from the insulating layer 18 is etched to form, from the n-type amorphous semiconductor layer 21, an n-type semiconductor layer 12n having a relatively thin portion 12n2 and a relatively thick portion 12n1.

Finally, in Step S8, the n-side electrode 14 and the p-side electrode 15 can be formed, respectively, on the n-type semiconductor layer 12n and the p-type semiconductor layer 13p to complete the solar cell 1.

The method used to form the n-side electrode 14 and the p-side electrode 15 is selected as appropriate depending on the electrode materials. The n-side electrode 14 and the p-side electrode 15 can be formed using a thin-film forming method, such as a sputtering method, CVD method or a vapor deposition method; a plating method; a conductive paste application method; or any combination of these methods. The n-side electrode 14 and the p-side electrode 15 can also be formed by dividing conductive film formed on the insulating layer 18 to cover the n-type semiconductor layer 12n and the p-type semiconductor layer 13p. In this case, the n-side electrode 14 and the p-side electrode 15 can be formed in a very precise shape at a narrow pitch.

The following is an explanation of other preferred embodiments of the present invention. In the following explanation, components having the same function as those in the first embodiment are denoted by the same reference numbers and further explanation of these components has been omitted.

2nd and 3rd Embodiments

Figure 9:
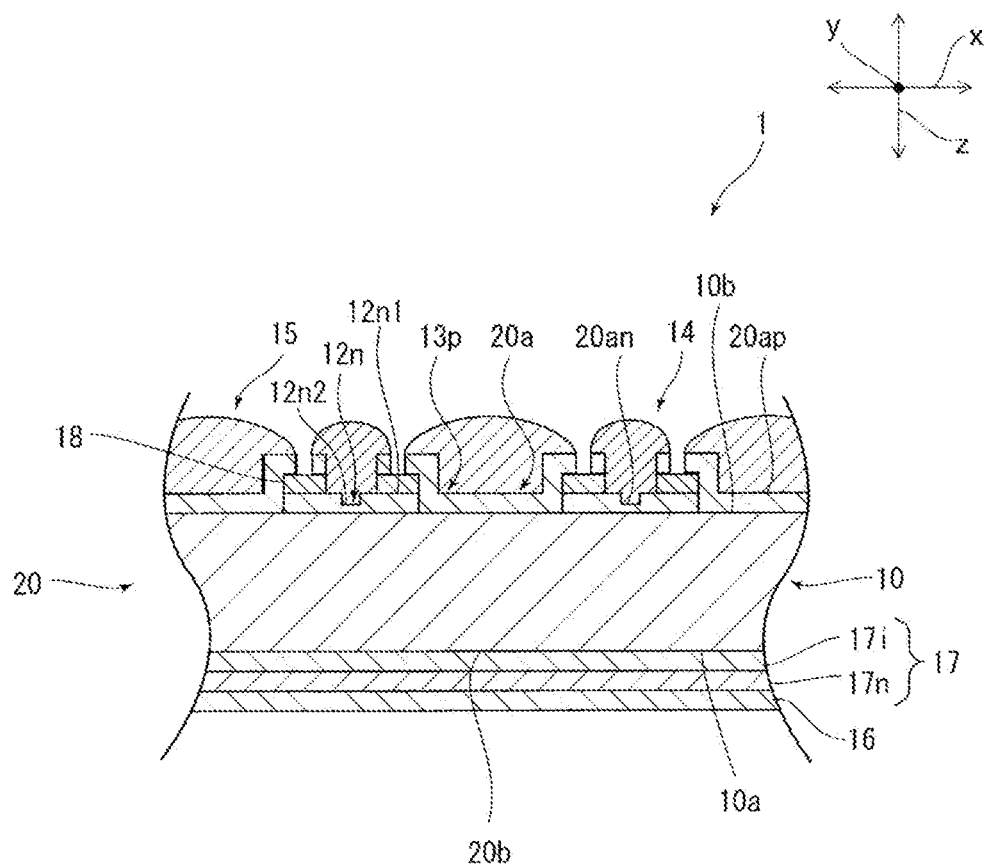
FIG. 9 is a schematic plan view of the solar cell in a second embodiment of the present invention.
Figure 10:
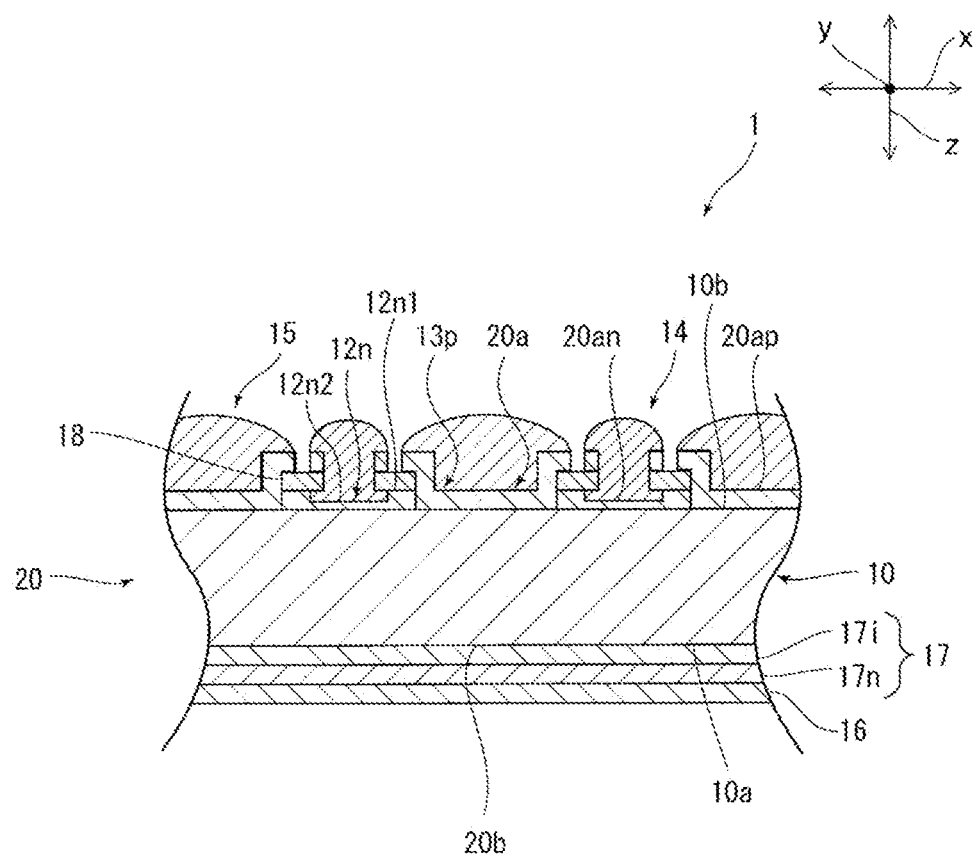
FIG. 10 is a schematic plan view of the solar cell in a third embodiment of the present invention.

FIG. 9 is a schematic plan view of the solar cell in a second embodiment of the present invention. FIG. 10 is a schematic plan view of the solar cell in a third embodiment of the present invention.

In the first embodiment, the relatively thin portion 12n2 was formed over the entire portion of the n-type semiconductor layer 12n exposed from the insulating layer 18, and was not formed beneath the insulating layer 18. However, the present invention is not limited in this way as long as the electrode is provided on the relatively thin portion of the semiconductor layer.

For example, as shown in FIG. 9, the relatively thin portion 12n2 may be provided in some of the portion exposed from the insulating layer 18 of the n-type semiconductor layer 12n. As shown in FIG. 10, the relatively thin portion 12n2 may be provided in part beneath the insulating layer 18 in addition to being provided over the entire portion exposed from the insulating layer 18 of the n-type semiconductor layer 12ng. In these cases, excellent photoelectric conversion efficiency similar to the solar cell 1 in the first embodiment can be realized.

4th and 5th Embodiments

Figure 11:
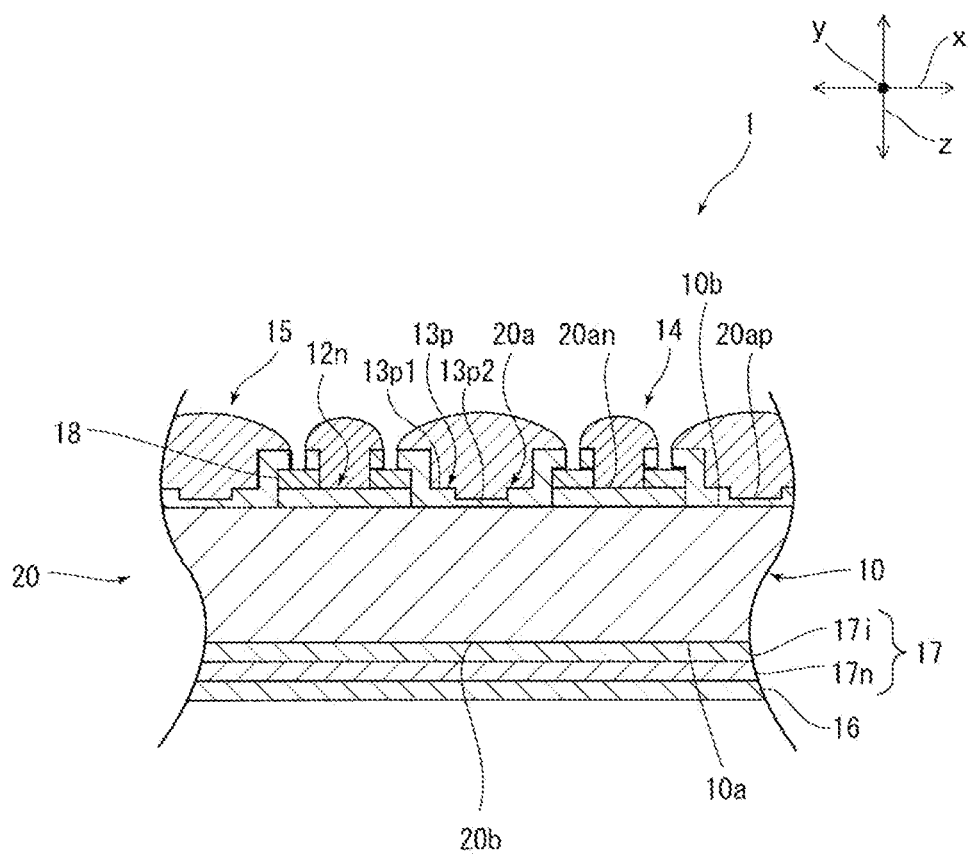
FIG. 11 is a schematic plan view of the solar cell in a fourth embodiment of the present invention.
Figure 12:
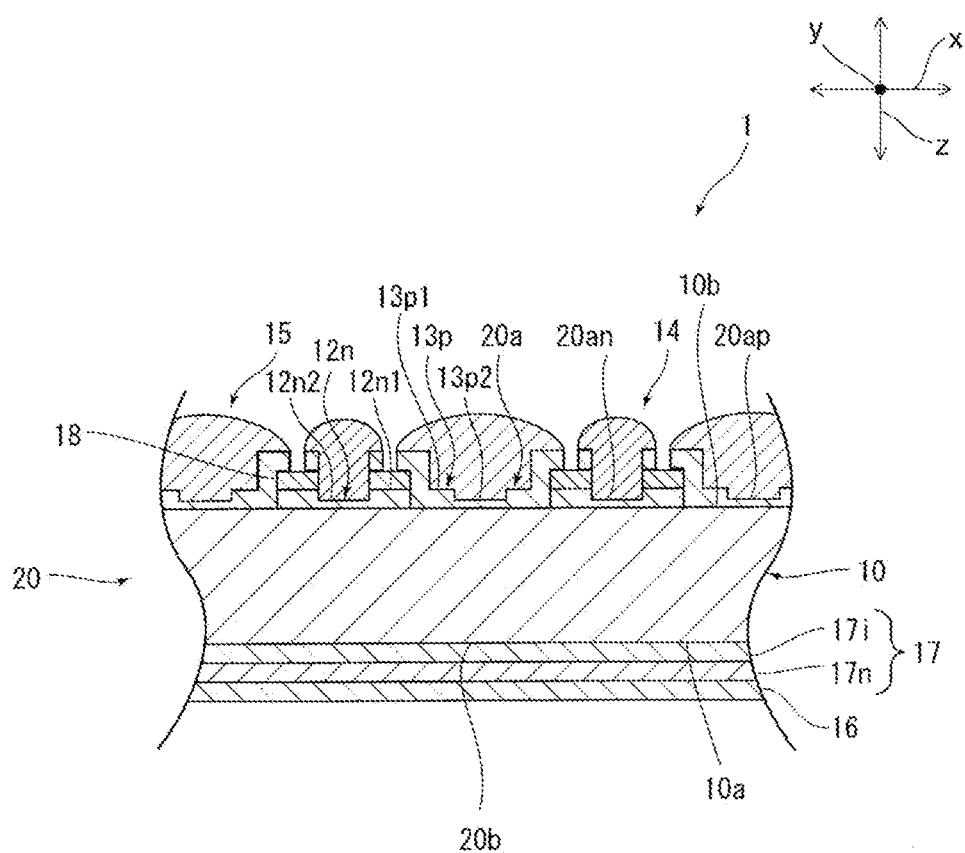
FIG. 12 is a schematic plan view of the solar cell in a fifth embodiment of the present invention.

FIG. 11 is a schematic plan view of the solar cell in a fourth embodiment of the present invention. FIG. 12 is a schematic plan view of the solar cell in a fifth embodiment of the present invention.

In the explanation of the first embodiment, a relatively thick portion 12n1 and a relatively thin portion 12n2 were provided on the n-type semiconductor layer 12n, and the p-type semiconductor layer 13p was substantially uniform in thickness. However, the present invention is not limited in this way as long as a relatively thin portion and a relatively thick portion are provided in a semiconductor layer.

For example, as shown in FIG. 11, a relatively thick portion 13p1 and a relatively thin portion 13p2 may be provided in the p-type semiconductor layer 13p, and the n-type semiconductor layer 12n may be substantially uniform in thickness. In this case, the resistance between the p-side electrode 15 and the semiconductor substrate 10 can be reduced, and the recombining of minority carriers generated beneath the n-type semiconductor layer 12n can be more effectively suppressed. Therefore, the minority carrier collection efficiency of the p-side electrode 15 can be further increased.

As shown in FIG. 12, while a relatively thick portion 12n1 and a relatively thin portion 12n2 are provided on the n-type semiconductor layer 12n, but a relatively thick portion 13p1 and a relatively thin portion 13p2 could also be provided. In this case, even higher photoelectric conversion efficiency can be realized.

6th Embodiment

Figure 13:
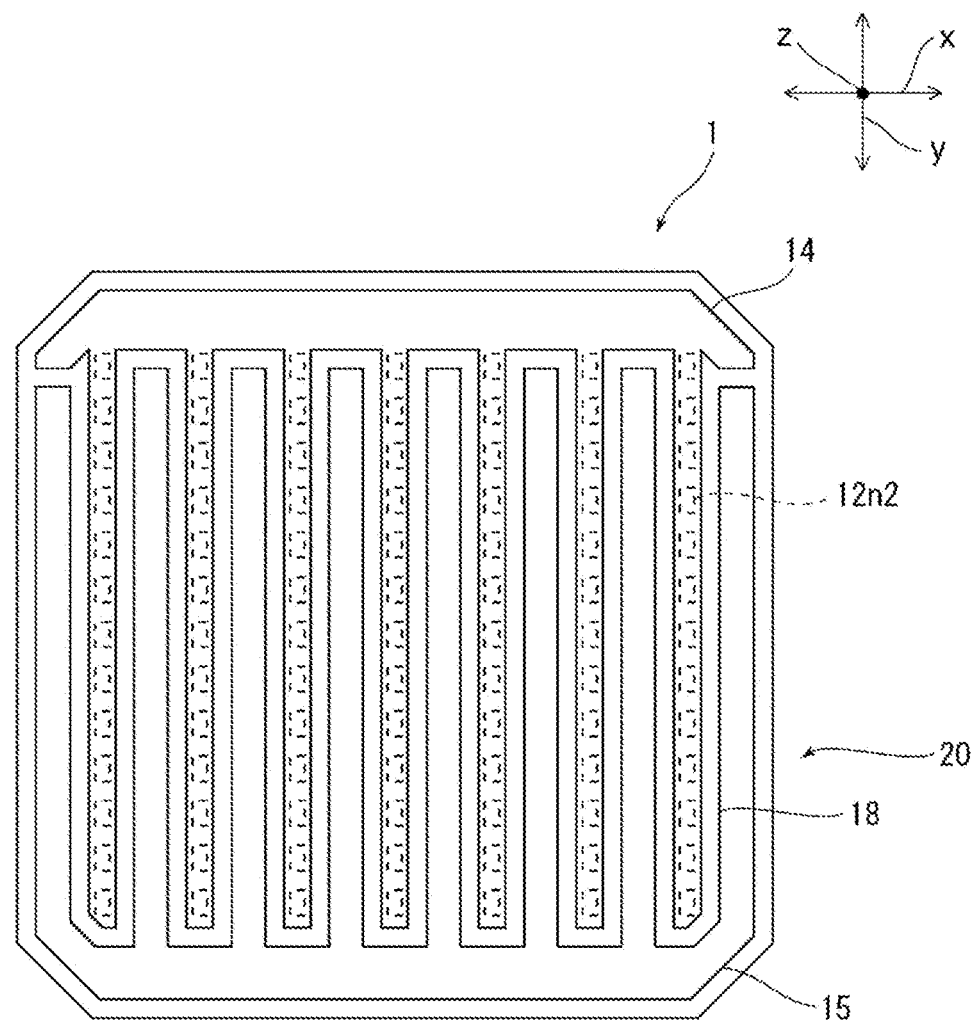
FIG. 13 is a schematic plan view of the solar cell in a sixth embodiment of the present invention.

FIG. 13 is a schematic plan view of the solar cell in a sixth embodiment of the present invention.

In the explanation of the first embodiment, the relatively thin portion 12n2 is provided continuously beneath the finger portion 14a from one end to the other in the longitudinal direction (y direction). However, in the present invention there are no particular limitations on the shape of the relatively thin portion of the semiconductor layer.

For example, as shown in FIG. 13, the relatively thin portion 12n2 may be provided only beneath a section of the finger portion 14a in the y direction. More specifically, in the sixth embodiment, the relatively thin portion 12n2 is provided discontinuously at reciprocal intervals beneath the finger portion 14a in the y direction. In this case, even higher photoelectric conversion efficiency can be realized.

7th and 8th Embodiments

Figure 14:
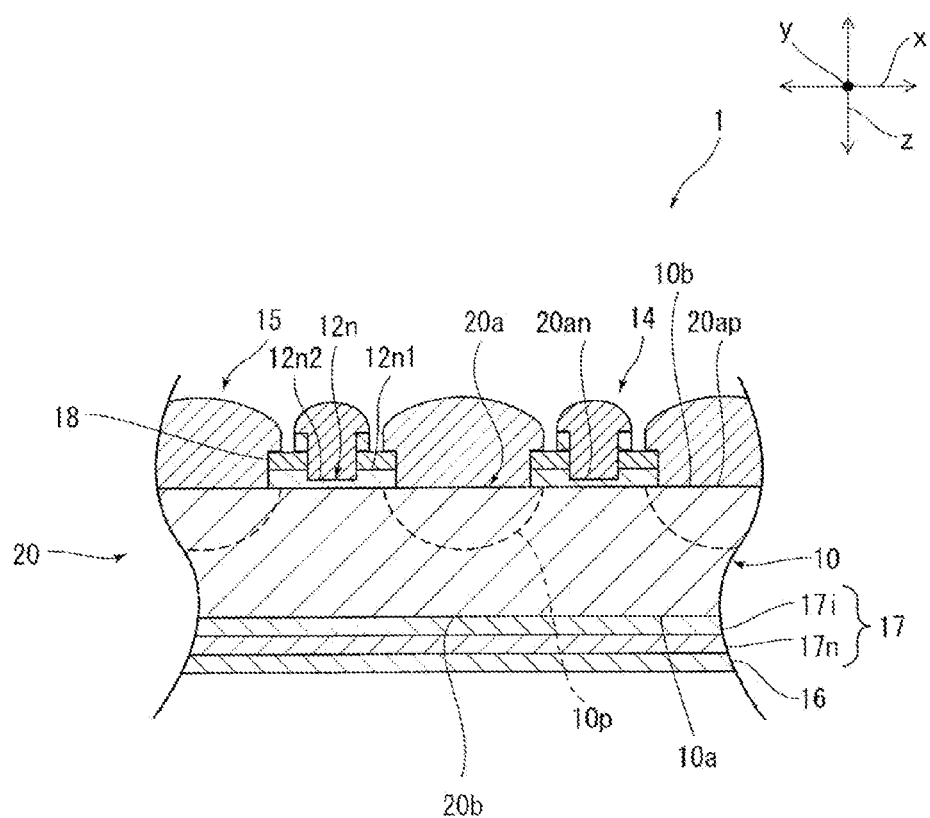
FIG. 14 is a schematic plan view of the solar cell in a seventh embodiment of the present invention.
Figure 15:
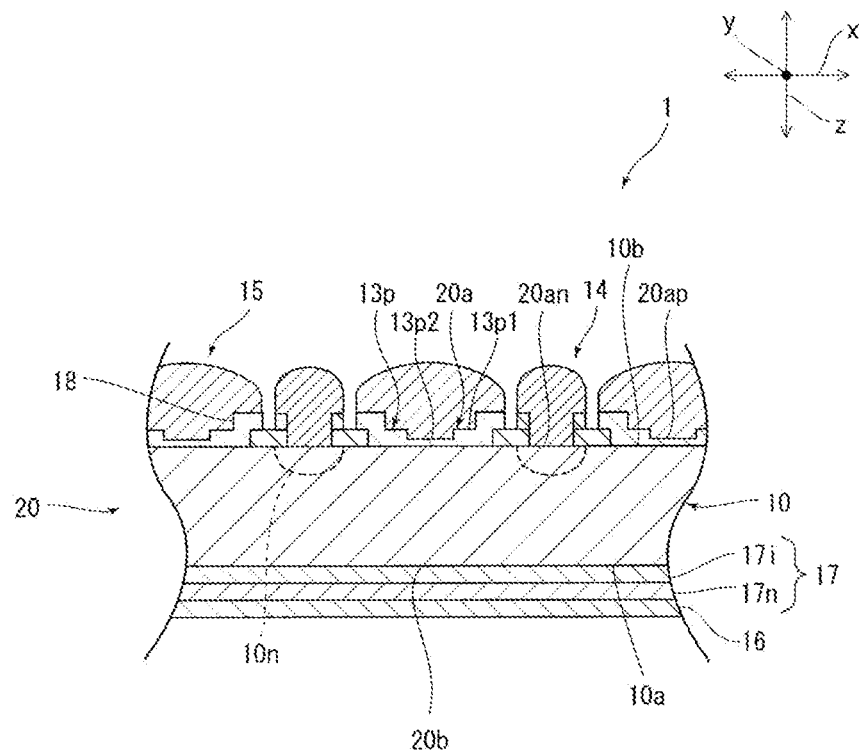
FIG. 15 is a schematic plan view of the solar cell in an eighth embodiment of the present invention.

FIG. 14 is a schematic plan view of the solar cell in a seventh embodiment of the present invention. FIG. 15 is a schematic plan view of the solar cell in an eighth embodiment of the present invention.

In the explanation of the first embodiment, both the p-type surface 20ap and the n-type surface 20an are constituted from the surfaces of semiconductor layers 12n and 13p. However, the present invention is not limited in this way as long as the photoelectric conversion unit has a semiconductor layer provided on a main surface of the semiconductor substrate, and an electrode is provided on the semiconductor layer.

For example, as shown in FIG. 14, the p-type surface 20ap may be composed from the p-type dopant diffusion region 10p provided so as to be exposed to the first main surface 10b of the semiconductor substrate 10. As shown in FIG. 15, the n-type surface 20an may be composed from the n-type dopant diffusion region 10n provided so as to be exposed to the first main surface 10b of the semiconductor substrate 10.

9th Embodiment

Figure 16:
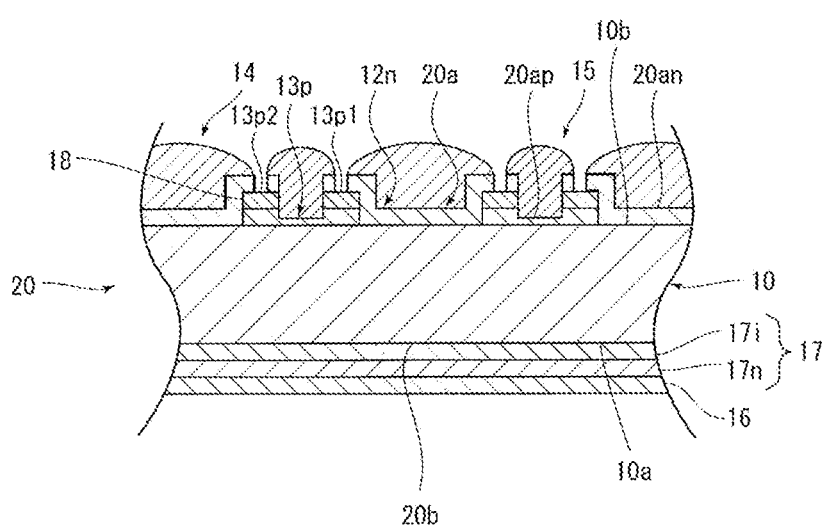
FIG. 16 is a schematic plan view of the solar cell in a ninth embodiment of the present invention.

FIG. 16 is a schematic plan view of the solar cell in a ninth embodiment of the present invention.

In the explanation of the first embodiment, an insulating layer 18 is provided on the n-type semiconductor layer 12n. However, the present invention is not limited to this configuration.

For example, as shown in FIG. 16, the insulating layer 18 may be provided on the p-type semiconductor layer 13p. The insulating layer may also be omitted.

10th Embodiment

Figure 17:
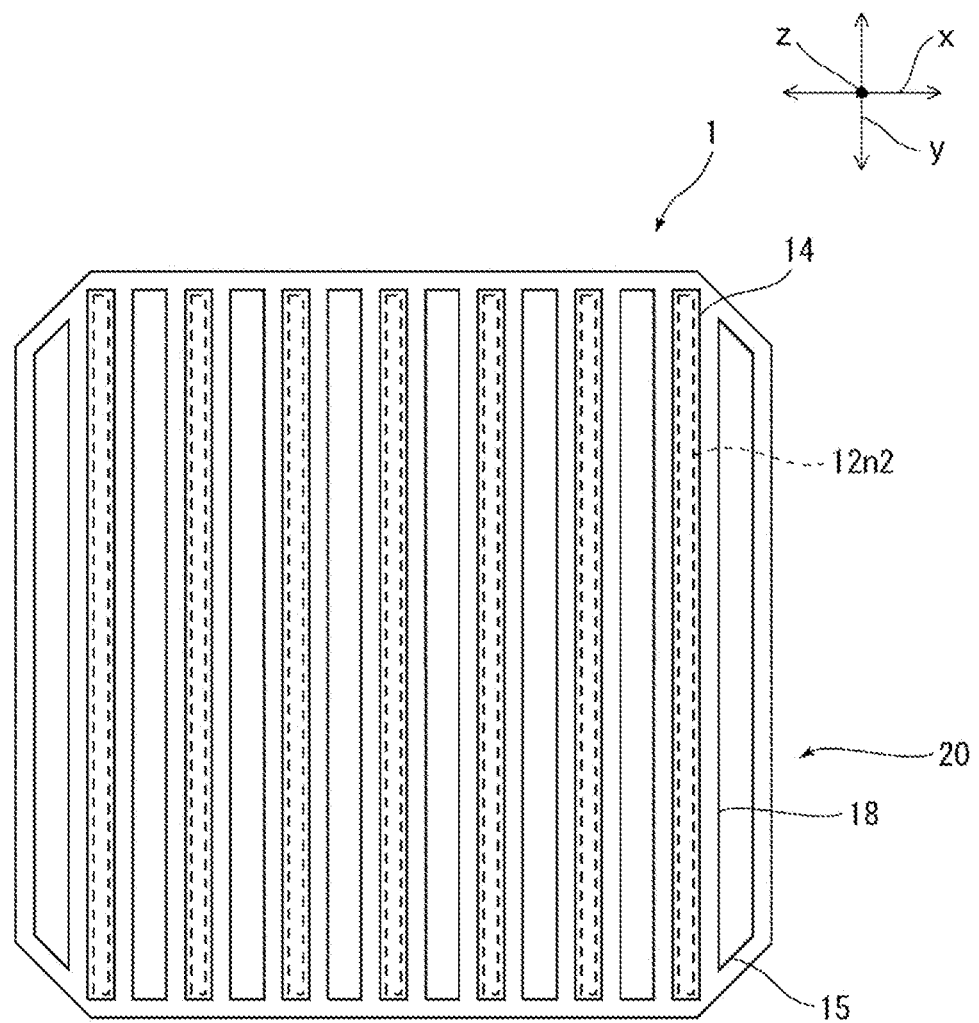
FIG. 17 is a schematic plan view of the solar cell in a tenth embodiment of the present invention.

FIG. 17 is a schematic plan view of the solar cell in a tenth embodiment of the present invention.

In the explanation of the first embodiment, the electrodes 14 and 15 had finger portions 14a and 15a, and busbar portions 14b and 15b. However, there are no particular limitations on the shape of the electrodes in the present invention.

However, as shown in FIG. 17, at least one of the n-side electrode 14 and the p-side electrode 15 does not have a busbar portion but only has finger portions 14a and 15a. More specifically, in the solar cell of the tenth embodiment, both the n-side electrode 14 and the p-side electrode 15 only have finger portions 14a and 15a.

The present invention includes many other embodiments not described herein. Therefore, the technical scope of the present invention is defined solely by the items of the invention specified in the claims pertinent to the above explanation.

KEY TO THE DRAWINGS

1: solar cell
10: semiconductor substrate
10a: 2nd main surface
10b: 1st main surface
12n: n-type semiconductor layer
12n1: relatively thick portion
12n2: relatively thin portion
13p: p-type semiconductor layer
13p1: relatively thick portion
13p2: relatively thin portion
14: n-side electrode
15: p-side electrode
14a, 15a: finger portions
14b, 15b: busbar portions
18: insulating layer
20: photoelectric conversion unit
20a: back surface
20an: n-type surface
20ap: p-type surface
20b: light-receiving surface

What is claimed is:
1. A solar cell comprising:
a photoelectric conversion unit having a first main surface including an n-type surface and a p-type surface, and a second main surface,
an n-side electrode connected electrically to the n-type surface, and
a p-side electrode connected electrically to the p-type surface, wherein the photoelectric conversion unit comprises:
a crystalline type semiconductor substrate having first and second main surfaces,
an amorphous semiconductor layer arranged on a portion of the first main surface of the photoelectric conversion unit and constituting either the n-type surface or the p-type surface, and
an insulating layer provided on a portion of the amorphous semiconductor layer;
wherein the amorphous semiconductor layer includes a thick portion positioned between the crystalline type semiconductor substrate and the insulating layer and covered with the insulating layer and a thinner portion that is exposed from the insulating layer,
wherein the thinner portion of the amorphous semiconductor layer does not overlap with the insulating layer when seen in a direction orthogonal to the first main surface of the crystalline type semiconductor substrate, wherein an interface surface between the amorphous semiconductor layer and the crystalline type semiconductor substrate is flat without having a textured structure, and wherein one of either the n-side electrode or the p-side electrode contacts on at least the thinner portion of the amorphous semiconductor layer.

2. The solar cell according to claim 1, wherein the amorphous semiconductor layer contains hydrogen.

3. The solar cell according to claim 1, wherein each of the n-side electrode and the p-side electrode includes a plurality of finger portions extending in a first direction and arranged at intervals in a second direction perpendicular to the first direction, the thinner portion of the amorphous semiconductor layer being provided beneath the finger portions.

4. The solar cell according to claim 3, wherein each of the n-side electrode and the p-side electrode further includes a collector portion connected electrically to the plurality of finger portions, the thinner portion of the amorphous semiconductor layer being provided beneath the collector portion of the n-side electrode.

5. The solar cell according to claim 1, wherein the photoelectric conversion unit has an additional semiconductor layer arranged in gaps on the first main surface of the crystalline type semiconductor substrate in which the amorphous semiconductor layer is not arranged, a portion of the additional semiconductor layer covers an edge of the insulating layer, and the insulating layer is sandwiched by the portion of the additional semiconductor layer and the amorphous semiconductor layer.

6. The solar cell according to claim 5, wherein the entire first main surface of the crystalline type semiconductor substrate is substantially covered by the amorphous semiconductor layer and the additional semiconductor layer.

7. The solar cell according to claim 1, wherein the thinner portion and the thick portion of the amorphous silicon layer are outside of the crystalline type semiconductor substrate with reference to the first main surface thereof.

8. A solar cell comprising:

a photoelectric conversion unit having a first main surface including an n-type surface and a p-type surface, and a second main surface, an n-side electrode connected electrically to the n-type surface, and a p-side electrode connected electrically to the p-type surface;

wherein the photoelectric conversion unit comprises:

a crystalline type semiconductor substrate having first and second main surfaces, an amorphous semiconductor layer arranged on a portion of the first main surface of the photoelectric conversion unit and constituting either the n-type surface or the p-type surface, and an insulating layer provided on a portion of the amorphous semiconductor layer;

wherein the amorphous semiconductor layer includes a thick portion positioned between the crystalline type semiconductor substrate and the insulating layer and covered with the insulating layer and a thinner portion that is exposed from the insulating layer, wherein the thinner portion of the amorphous semiconductor layer does not overlap with the insulating layer when seen in a direction orthogonal to the first main surface of the crystalline type semiconductor substrate, wherein an interface surface between the amorphous semiconductor layer and the crystalline type semiconductor substrate is flat without having a textured structure, wherein one of either the n-side electrode or the p-side electrode contacts on at least the thinner portion of the amorphous semiconductor layer, wherein the photoelectric conversion unit has an additional semiconductor layer arranged in gaps on the first semiconductor main surface in which the amorphous semiconductor layer is not arranged, wherein the additional semiconductor layer includes a thick portion and a thinner portion, and wherein the other of either the n-side electrode or the p-side electrode contacts on at least the thinner portion of the additional semiconductor layer.

9. The solar cell according to claim 8, wherein the additional semiconductor layer contains hydrogen.

10. The solar cell according to claim 8, wherein the thinner portion and the thick portion of the amorphous silicon layer are outside of the crystalline type semiconductor substrate with reference to the first main surface thereof.

* * * * *